United States Patent [19]
Graf

[11] Patent Number: 5,258,946
[45] Date of Patent: Nov. 2, 1993

[54] CONTENT-ADDRESSABLE MEMORY

[75] Inventor: Hans P. Graf, East Keansburg, N.J.

[73] Assignee: AT&T Bell Laboratories, Murray Hill, N.J.

[21] Appl. No.: 654,845

[22] Filed: Feb. 13, 1991

[51] Int. Cl.⁵ .......................... H03F 3/45; H03K 19/23
[52] U.S. Cl. ............................ 365/49; 365/189.04; 365/189.07; 307/201; 307/530; 307/464
[58] Field of Search .................. 307/201, 530, 464; 365/49, 189.04, 189.07

[56] References Cited

U.S. PATENT DOCUMENTS 3,633,182  1/1972  Koo ....................................... 340/173
4,780,845  10/1988  Threewitt ............................ 365/49

OTHER PUBLICATIONS

J. T. Koo, IEEE J. of Solid-State Circuits, Oct. 1970, "Integrated-Circuit Content-Addressable Memories", pp. 263-270.

T. Kohonen, Springer-Verlag 1980, pp. 199-203, "Content-Addressable Memories".

Clark et al., IEEE J. of Solid-State Circuits, vol. 24, No. 1, Feb. 1989, "A Pipelined Associative Memory . . . ", pp. 28-34.

Ogura et al., IEEE J. of Solid-State Circuits, vol. 24, No. 4, Aug. 1989, "A 20-kbit Associative Memory LSI . . . ", pp. 1014-1020.

J. P. Wade et al., IEEE J. of Solid-State Circuits, vol. 24, No. 4, Aug. 1989, "A Ternary Content Addressable Search Engine", pp. 1003-1013.

Graf et al., IEEE International Solid-State Circuits Conf., 1990, "A Reconfigurable CMOS Neural Network", pp. 144-145.

Primary Examiner—Margaret Rose Wambach
Attorney, Agent, or Firm—Gregory C. Ranieri

[57] ABSTRACT

A measure of the correlation or degree of closeness between an input data pattern and a stored data pattern is achieved directly from content-addressable memory cells which are realized in accordance with the principles of the present invention to provide a match/non-match output indication which is summable with other such match/non-match output indications on a match bus line for computing the correlation or degree of closeness measure. Each content-addressable memory cell includes a single bit, static random access memory cell and a comparing logic gate connected jointly to the output of the static random access memory cell and the bit bus line for the single bit of the input data pattern. Output of the comparing logic gate is connected to the match bus line and is generated as a fixed amount of current which can be summed with other current on the match bus line. The output stage of the comparing gate is thus operated as a current source. Each content-addressable memory cell accepts digital input signals and delivers a usable analog output signal. In one embodiment, the content-addressable memory cell is realized in a complementary metal oxide semiconductor technology and the comparing logic gate is an exclusive-NOR gate.

9 Claims, 2 Drawing Sheets

CONTENT-ADDRESSABLE MEMORY

TECHNICAL FIELD

This invention relates to high speed computing systems and, more particularly, to content-addressable memory cells and artificial neural network connection elements.

BACKGROUND OF THE INVENTION

Pattern recognition is an important function for associative addressable or content-addressable memories and neural networks. For content-addressable memories, pattern recognition has long been performed in custom integrated circuits. These circuits store data at random memory locations and provide a positive indication when an input word perfectly matches a data word stored in one of the memory locations. Digital logic has been utilized for implementations of such circuits. A review of these memories with exemplary circuits is found in *Content-Addressable Memories* by T. Kohonen, pages 199–203 (Springer-Verlag 1980).

In U.S. Pat. No. 4,780,845, a content-addressable memory cell is shown consisting of a dynamic random-access memory (DRAM) connected and an exclusive-NOR (XNOR) gate. For each cell, one bit of the input word is compared to the corresponding bit in the stored word via the exclusive-NOR gate to generate a match signal or non-match signal. The outputs from the exclusive-NOR gates comprising the cells grouped together to form a word within the content-addressable memory are connected to the same output bus line which is commonly called the match line. Connection of the exclusive-NOR outputs to the match line as shown in the '845 patent is a wired-OR connection. That is, if any one bit of the input word fails to match the bit in the corresponding bit position of the stored word, then the entire match fails and the match line is forced to a level signifying a non-match or match failure condition.

In general, for known content-addressable memories such as the one in the '845 patent, there is no attempt to indicate the correlation or degree of closeness for a match between the input word and stored words. That is, this content-addressable memory cell having a wired-OR match line cannot indicate that the input word, while not exactly matching a stored word, most closely matched a particular stored word.

In U.S. Pat. No. 3,633,182 and a technical article from *IEEE J. Solid-State Circuits*, Vol. SC-5, pp. 208–215 (1970), an alternative content-addressable memory cell is shown consisting of a static random-access memory (SRAM) or flip-flip in combination with a comparing logic gate. The operation of this content-addressable memory is substantially identical to the operation of the memory in the '845 patent described above. Each bit of the input word is compared to the bit in the corresponding position from the word stored in the associated SRAMs. The output from each associated comparing logic gate is connected to a match line. When the comparison fails in one of the comparing logic gates for a stored word, the comparing logic gate operates in a manner to force the match line to exhibit a level indicative of match failure or non-match, just as in the '845 patent described above. There is no attempt in this memory to indicate the correlation or degree of closeness for a match between the input word and the stored words. Only exact matches between the input word and a stored word can be indicated by this memory.

As this area continued to develop, it became apparent that the parallel searching architecture of the content-addressable memory would be suited for use in the parallel computing structures employed in artificial neural networks. But in pattern recognition applications, artificial neural networks attempt to measure the degree to which an input pattern matches a stored template. This task, of course, is not directly achievable with standard content-addressable memories such as those described above. To this end, large distributed computing structures built around the content-addressable memory have been proposed to handle the more complex problem of recognizing a close match or the best match rather than the exact match. In some applications, the recognition of a close match is called a "less-than" or "greater-than" match. The large distributed computing structures have been realized primarily by utilizing a bit-serial search engine in conjunction with a content-addressable memory. See descriptions of these structures in *IEEE J. Solid-State Circuits*, Vol. 24, No. 4, pp. 1014–20 (1989); *IEEE J. Solid-State Circuits*, Vol. 24, No. 4, pp. 1003–13 (1989); and *IEEE J. Solid-State Circuits*, Vol. 24, No. 1, pp. 28–34 (1989). Such large distributed computing structures are necessitated by the requirement of achieving high throughput for large-bit length data. It is important to note that each of the content-addressable memory cell circuits described in the articles cited directly above provide a wired-OR output to the match line so that failure to match in one bit position causes the entire match to fail and exhibit the match failure condition on the match line. As a result, the computing structures surrounding the content-addressable memory are quite large and awkward on order to achieve a certain level of artificial intelligence.

SUMMARY OF THE INVENTION

A measure of the correlation or degree of closeness between an input data pattern and a stored data pattern is achieved directly from content-addressable memory cells which are realized in accordance with the principles of the present invention to provide a match/non-match output indication which is summable with other such match/non-match output indications on a match bus line for computing the correlation or degree of closeness measure. Each content-addressable memory cell includes a single bit, static random access memory cell and an comparing logic gate connected jointly to the output of the static random access memory cell and the bit bus line for the single bit of the input data pattern. Output of the comparing logic gate is connected to the match bus line and is generated as a fixed amount of constant current which can be summed with other fixed amounts of constant current on the match bus line. The output stage of the comparing gate is thus operated as a constant current source. Each content-addressable memory cell accepts digital input signals and delivers a usable analog output signal.

In one embodiment, the content-addressable memory cell is realized in a complementary metal oxide semiconductor technology and the comparing logic gate is an exclusive-NOR gate.

With the present content-addressable memory cell configuration, it is possible to realize connection elements for neurons in artificial neural networks.

BRIEF DESCRIPTION OF THE DRAWING

A more complete understanding of the invention may be obtained by reading the following description of a specific illustrative embodiment of the invention in conjunction with the appended drawing in which.

DETAILED DESCRIPTION

Figure 1:
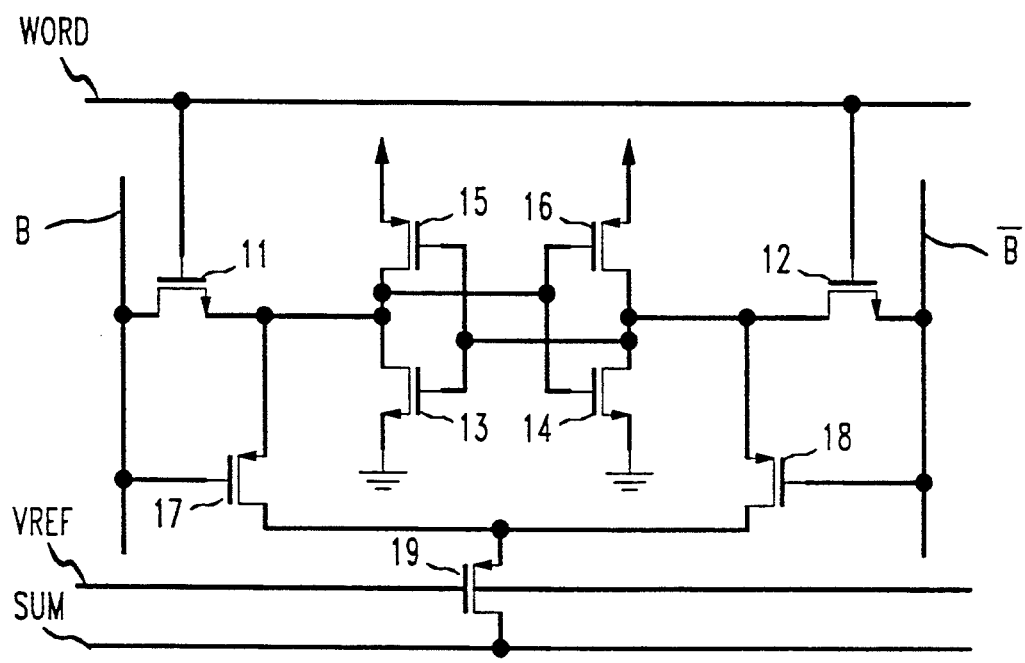
FIG. 1 shows a single content-addressable memory cell realized in accordance with the principles of the present invention.

FIG. 1 shows the schematic diagram of a content-addressable memory cell realized in accordance with the principles of the invention. The content-addressable memory cell has three major portions: a storage cell or flip-flop comprising field effect transistors 13, 14, 15, and 16; accessing circuitry including field effect transistors 11 and 12; and a content-addressable accessing circuit including field effect transistors 17, 18, and 19.

The storage cell is a conventional static random access memory (SRAM) cell in which a complementary pair of field effect transistors is coupled across to another complementary pair of transistors. One pair of transistors includes transistor 13 (NMOS) and transistor 15 (PMOS); the other pair of transistors includes transistor 14 (NMOS) and transistor 16 (PMOS). Within each pair of transistors, the gates of the transistors are connected together, the drains are connected together, the source of the NMOS transistor is connected to ground, and the source of the PMOS transistor is connected to an appropriate supply voltage. The common gate node in each pair of transistors is connected to the common drain node in the other pair of transistors. Also, the common drain node in each pair of transistors serves as a bit output terminal of the random access memory cell. A signal appearing at the bit output terminal between transistors 13 and 15 is always the complement of the concomitant signal appearing at the bit output terminal between transistors 14 and 16.

Accessing circuitry transistors 11 and 12, both NMOS, are connected in a well known manner between the bit output terminals of the storage cell and a pair of bit lines B and $\overline{B}$. As shown in FIG. 1, the drain of transistor 11 is connected to bit line B and the source is connected to the bit output terminal between transistors 13 and 15, whereas the source of transistor 12 is connected to bit line $\overline{B}$ and the drain of the transistor is connected to the bit output terminal between transistors 14 and 16. Gates of transistors 11 and 12 are connected together by a word access line labeled WORD. It is the function of the accessing circuitry to permit reading and writing of the storage cell. That is, the accessing circuitry permits modification or interrogation of the contents in the storage cell.

To write information into the storage cell, word access line WORD is energized to enable field effect transistors 11 and 12. When transistors 11 and 12 have been enabled, a low impedance path is provided between both bit lines and the respective bit output terminals. For example, when transistor 11 is energized, a low impedance path exists between bit line B and the bit output terminal at the common drain node between transistors 13 and 15. After the access circuitry transistors have been enabled, appropriate signals are applied to bit lines B and $\overline{B}$ to set the contents of the storage cell to the appropriate value. It should be noted that, when the drive applied voltage is supplied to bit line B, the complement of the applied voltage is concurrently supplied to bit line $\overline{B}$. If the storage cell already contains the desired contents when the writing signals are applied, no change occurs to the contents of the storage cell.

In order to read stored contents out of the storage cell, WORD access line is energized to enable transistors 11 and 12. The voltage across bit lines B and $\overline{B}$ can then be sensed when a high-input impedance differential amplifier is enabled to nondestructively sense the state (contents) of the storage cell via bit lines B and $\overline{B}$.

Transistors 17, 18, and 19, all PMOS, comprise the content-addressable accessing circuit. This circuit receives inputs from bit lines B and $\overline{B}$ and from both bit output terminals of the storage cell. Output of the circuit is provided on a match line called SUM. When the input data bit appearing on bit lines B and $\overline{B}$ matches the contents of the storage cell appearing at the bit output terminals, the content-addressable accessing circuit provides a constant current output to match line SUM.

As shown in FIG. 1, the gate of transistor 17 is connected to bit line B, the source is connected to the bit output terminal of the storage cell at the common drain junction between transistors 13 and 15, and the drain is connected to the source of transistor 19. In a similar manner, the gate of transistor 18 is connected to bit line $\overline{B}$, the source is connected to the bit output terminal of the storage cell at the common drain junction between transistors 14 and 16, and the drain is connected to the source of transistor 19. With respect to transistor 19, the gate is held to a reference potential VREF and the drain is connected to match line SUM. In this arrangement, transistor 19 acts as a current source. To operate as a constant current source, transistor 19 has its gate potential VREF chosen to be between the voltage on the match line SUM, $V_{SUM}$, and the voltage on the source of transistor 19, $V_{SOURCE,19}$, when each voltage $V_{SUM}$ and $V_{SOURCE,19}$ is raised to a high condition and subject to an offset by the switching voltage $V_T$ for transistor 19. By selecting VREF to be greater than $V_{SUM}-V_T$, current is inhibited from flowing through transistor 19 from match line SUM. By simultaneously selecting VREF to be less than $V_{SOURCE,19}-V_T$, current is permitted to flow through transistor 19 toward match line SUM when a high condition exists at the source of transistor 19. Thus, $V_{SOURCE,19}$ at a high condition and $V_T$ determine the amount of current delivered by a memory cell to match line SUM when a match condition occurs in the cell.

Several examples are presented below to understand operation of the content-addressable memory cell during content-addressing. It is assumed that a high voltage (logical 1 or +1) is applied to bit line B and that the bit output terminal of the storage cell sensed by the source of transistor 17 is also at a high voltage level (logical 1 or +1). As a result, the source of transistor 19 is pulled up to a high voltage level causing transistor 19 to supply a constant current output on match line SUM signifying occurrence of a match. This example corresponds to the case where the contents of the storage cell are matched by the value of the input data on bit line B. While this example corresponds to the case when the contents of the storage cell are set to a logical 1 or +1 (high voltage setting), it will be clear to those skilled in the art that the result holds true for the case where the contents of the storage cell are set to a logical 0 or −1 (complement of high voltage setting) and those contents are matched by the value of the input data on bit line B. In another example, it is assumed that a high voltage (logical 1 or +1) is applied to bit line B and that the bit output terminal of the storage cell sensed by the source of transistor 17 is at a complement of the high voltage level (logical 0 or −1). As a result, the source of transistor 19 is pulled down to the complement of the high voltage level (logical 0 or −1) causing transistor 19 to be turned off. This example corresponds to the case where the contents of the storage cell are not matched by the value of the input data on bit line B. While this example corresponds to the case when the contents of the storage cell are set to a logical 1 or +1 (high voltage setting) and the input data bit is a logical 0 or −1 (complement of the high voltage setting) on bit line B, it will be clear to those skilled in the art that the result holds true for the case where the contents of the storage cell are set to a logical 0 or −1 (complement of high voltage setting) and the input data bit is a logical 1 or +1 (high voltage setting) on bit line B.

From the examples given above, it is understood that the content-addressable memory cell performs a one bit exclusive NOR between the contents of the storage cell and the input data bit. This is a logical function used for comparing several input values, that is, measuring the similarity or dissimilarity of separate inputs. For the case where the input data bit matches the bit stored in the storage cell, the output on the SUM line is either a logical 1 or +1 (high voltage setting). For the case where the input data bit fails to match the bit stored in the storage cell, the output on the SUM line is either a logical 0 or −1 (complement of high voltage setting). It should be noted that this is also known as a four quadrant multiplication or scalar multiplication between the stored value and the value of the input data bit. Such multiplication functions are necessary to realize each individual connection which comprises a neuron in an artificial neural network.

An alternative mode of operation may be achieved by placing the data bit on bit line B and by forcing bit line $\overline{B}$ to be a logical 0 or −1 (complement of high voltage setting). In this manner, a one bit binary multiplication is performed and the content-addressable accessing circuit including transistors 17, 18, and 19 functions as a logical AND gate.

An important feature of the circuit shown in FIG. 1 is the use of transistor 19 as a current source. In this configuration, transistor 19 isolates transistors 11 through 18 from match line SUM and, as a result, permits the constant current from one memory to be added to the current on match line SUM. In effect, the memory accepts digital inputs and provides the capability for computing an analog (multi-level) output. For each word stored in a large content-addressable memory such as the partial memory shown in FIG. 2, the number of individual bit matches between the input data word and the stored words is available on each match line SUM as an analog value. As a result, the present memory the degree of closeness for each match is preserved on match line SUM by virtue of the operation of transistor 19 in each content-addressable memory cell.

Figure 2:
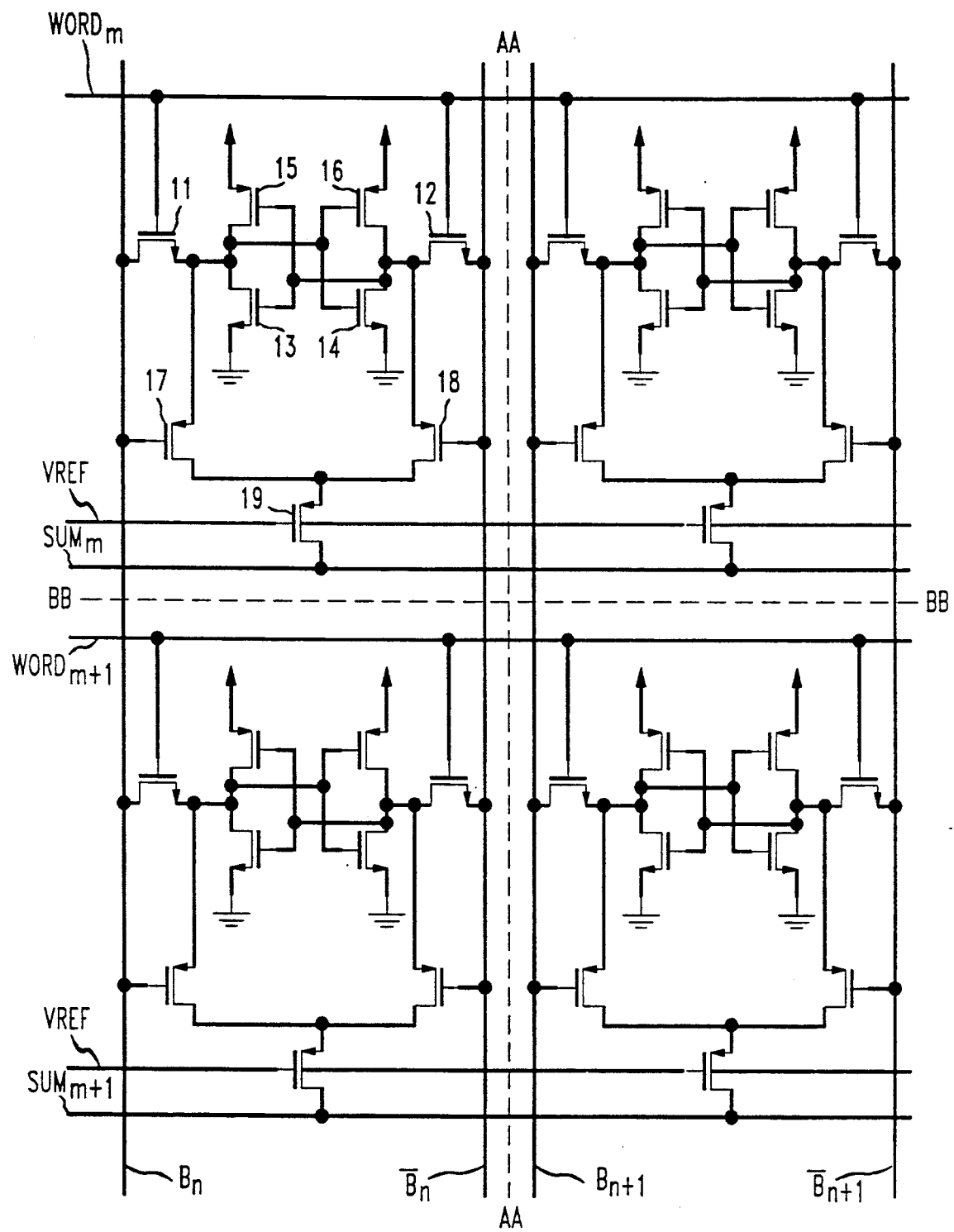
FIG. 2 shows an interconnection of four content-addressable memory cells to realize portions of two separate words in a content-addressable memory.

FIG. 2 shows a combination of four content-addressable memory cells to form a partial content-addressable memory. Both upper cells are connected by word line $WORD_m$ whereas both lower cells are connected by word line $WORD_{m+1}$. The upper cells provide the results of the content matching operation on match line $SUM_m$ whereas the lower cells provide the results of the content matching operation on match line $SUM_{m+1}$. The left hand pair of cells receive data input from bit lines $B_n$ and $\overline{B}_n$ whereas the right hand pair of cells receive data input from bit lines $B_{n+1}$ and $\overline{B}_{n+1}$. This memory organization is well known and has been provided to demonstrate the manner in which the present content-addressabler memory cell may be adapted for use in a word organized memory.

The cell shown in FIG. 1 is realized with standard complementary metal oxide semiconductor field effect transistors, namely PMOS and NMOS FETs. Other types of transistor devices are contemplated for substitution in the cell. Also, it is contemplated that the storage cell be of the dynamic random access memory type.

The cell shown in the FIGURES is also capable of "don't care" matching or bit masking operation. In this type of operation, the matching function is performed without regard to the contents of the storage cell. Such operation is invoked by operating the bit lines B and $\overline{B}$ at the complement of the high voltage level.

I claim:

1. A semiconductor memory device having a bit line, a bit complement line, a word line, and a match line, the semiconductor memory device comprising:
    a random access memory cell for storing a single bit, the random access memory cell coupled to the bit line, to the bit complement line, and to the word line; and
    a logic gate for performing a bit comparison function, the logic gate coupled to the random access memory cell, to the bit line, to the bit complement line, and to the match line;
    wherein the logic gate further comprises:
    means for controllably supplying a constant current output to the match line when a signal from the bit line matches a signal from the random access memory cell wherein a voltage condition of the match line is not altered if a signal from the bit line does not match a signal from the random access memory cell.

2. The semiconductor memory device defined in claim 1 wherein the random access memory cell is a static random access memory element.

3. The semiconductor memory device defined in claim 2 wherein the random access memory cell further comprises:
    means for accessing contents stored in the random access memory cell to permit reading from, and writing to, the random access memory cell, the accessing means coupled to the word line, the bit and bit complement lines, and to the random access memory cell.

4. The semiconductor device as defined in claim 1 wherein the logic gate performs an exclusive-NOR function.

5. The semiconductor device as defined in claim 1 wherein the logic gate performs a logical AND function.

6. The semiconductor memory device defined in claim 1 wherein the random access memory cell is a dynamic random access memory cell.

7. The semiconductor memory device defined in claim 1 wherein the random access memory cell is a flip-flop.

8. A semiconductor memory device having a bit line, a bit complement line, a word line, and a match line, the semiconductor memory device comprising:

a random access memory cell for storing a single bit, the random access memory cell coupled to the bit line, to the bit complement line, and to the word line; and a logic gate for performing a bit comparison function, the logic gate coupled to the random access memory cell, to the bit line, to the bit complement line, and to the match line;

wherein the logic gate further comprises:

a first transistor having a first source/drain terminal coupled to the random access memory cell, a gate terminal coupled to the bit line, and a second source/drain terminal;

a second transistor having a first source/drain terminal coupled to the random access memory cell, a gate terminal coupled to the bit complement line, and a second source/drain terminal; and a third transistor having a first source/drain terminal coupled to the second source/drain terminal of the first and second source/drain terminal coupled to the match line, the third transistor for controllably supplying a constant current output to the match line when a signal from the bit line matches a signal from the random access memory cell.

9. The semiconductor memory device defined in claim 6 wherein the first, second, and third transistors are PMOS field effect transistors.

* * * * *